United States Patent
Masui et al.

(10) Patent No.: US 12,507,520 B2
(45) Date of Patent: Dec. 23, 2025

(54) ULTRA-SMOOTH SIDEWALL PIXELATED ARRAY LEDs

(71) Applicant: Lumileds LLC, San Jose, CA (US)

(72) Inventors: Hisashi Masui, San Jose, CA (US);
Ken Shimizu, Sunnyvale, CA (US);
Emma Dohner, Redwood City, CA (US)

(73) Assignee: Lumileds Singapore Pte. Ltd., Singapore (SG)

( * ) Notice: Subject to any disclaimer, the term of this patent is extended or adjusted under 35 U.S.C. 154(b) by 339 days.

(21) Appl. No.: 18/113,514

(22) Filed: Feb. 23, 2023

(65) Prior Publication Data
US 2023/0197766 A1 Jun. 22, 2023

Related U.S. Application Data (63) Continuation of application No. 17/157,533, filed on Jan. 25, 2021, now Pat. No. 11,621,292, which is a
(Continued)

(51) Int. Cl.
*H10H 29/14* (2025.01)
*H10H 20/851* (2025.01)
(Continued)

(52) U.S. Cl.
CPC ...... *H10H 29/142* (2025.01); *H10H 20/8512* (2025.01); *H10H 20/856* (2025.01);
(Continued)

(58) Field of Classification Search
CPC ..... H01L 2933/0033; H01L 2933/0041; H01L 2933/0058; H01L 33/46; H01L 33/505;
(Continued)

(56) References Cited

U.S. PATENT DOCUMENTS

| 5,302,423 A * | 4/1994 | Tran ............... G21K 4/00 |
| | | 427/404 |
| 9,822,002 B1 * | 11/2017 | Andry ............... B81B 3/0097 |

(Continued)

FOREIGN PATENT DOCUMENTS

| CN | 103153611 A | 6/2013 |
| CN | 107968141 A | 4/2018 |

(Continued)

OTHER PUBLICATIONS

International Search Report where the EPO is the ISA, PCT/IB2019/001380, dated May 25, 2020. 5 pages.
(Continued)

*Primary Examiner* — Shahed Ahmed (57) ABSTRACT

Pixelated array light emitters are formed with closely-spaced pixels having ultra-smooth sidewalls. In methods for making such pixelated array light emitters, a converter layer of phosphor particles dispersed in a binder is disposed on a carrier, and then singulated by saw cuts or similar methods to form an array of phosphor pixels. The binder is fully cured prior to singulation of the converter layer. Further, the carrier is rigid rather than flexible. As a consequence of fully curing the binder and of using a rigid carrier to support the converter layer, singulation results in phosphor pixels having smooth side walls. The array of phosphor pixels is subsequently attached to a corresponding array of LEDs with an adhesive layer, separate from the binder used to form the converter layer. The pixel sidewalls may be formed with controlled morphology, for example at acute or obtuse angles with respect to the carrier.

19 Claims, 6 Drawing Sheets

Related U.S. Application Data continuation of application No. 16/358,092, filed on Mar. 19, 2019, now Pat. No. 10,903,266.

(60) Provisional application No. 62/787,053, filed on Dec. 31, 2018.

(51) Int. Cl.
*H10H 20/856* (2025.01)
*H10H 20/01* (2025.01)

(52) U.S. Cl.
CPC ....... *H10H 20/036* (2025.01); *H10H 20/0361* (2025.01); *H10H 20/0363* (2025.01)

(58) Field of Classification Search
CPC ........... H01L 33/501; H01L 2933/0025; H01L 25/0753; H01L 33/50–508; H01L 31/055; H01L 33/00–648; H01L 27/15–156; H01L 2933/00–0091; H01L 21/76841–76876; H10H 29/142; H10H 20/8512; H10H 20/856; H10H 20/036; H10H 20/0361; H10H 20/0363; H10D 86/0227

See application file for complete search history.

(56) References Cited

U.S. PATENT DOCUMENTS

| | | | |
|---|---|---|---|
| 10,014,450 B1* | 7/2018 | Mak | H01L 33/505 |
| 11,621,292 B2 | 4/2023 | Masui et al. | |
| 2010/0255264 A1 | 10/2010 | Ishida et al. | |
| 2010/0295077 A1 | 11/2010 | Melman | |
| 2011/0255264 A1 | 10/2011 | Tsutsumi et al. | |
| 2014/0319560 A1* | 10/2014 | Tischler | H01L 24/97 257/98 |
| 2014/0339582 A1 | 11/2014 | Matsumura et al. | |
| 2017/0074467 A1 | 3/2017 | Roth | |
| 2020/0098950 A1* | 3/2020 | Basin | H01L 33/505 |

FOREIGN PATENT DOCUMENTS

| | | |
|---|---|---|
| EP | 2610058 A | 7/2013 |
| WO | 2015/193763 A1 | 12/2015 |

OTHER PUBLICATIONS

Written Opinion of the International Searching Authority, PCT/IB2019/001380, dated May 25, 2020, 5 pages.

* cited by examiner

ULTRA-SMOOTH SIDEWALL PIXELATED ARRAY LEDs

CROSS REFERENCE TO RELATED APPLICATIONS

This application is a continuation of U.S. application Ser. No. 17/157,533 filed on Jan. 25, 2021, which claims priority to U.S. application Ser. No. 16/358,092 filed on Mar. 19, 2019 (now U.S. Pat. No. 10,903,266), which claims priority to U.S. Provisional Patent Application No. 62/787,053 filed Dec. 31, 2018. All of the above applications are incorporated herein by reference in their entirety.

FIELD OF THE INVENTION

The invention relates generally to phosphor-converted light emitting diodes.

BACKGROUND

Semiconductor light emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength converting materials (generally referred to herein as "phosphors") that absorb light emitted by the LED and in response emit light of a longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer.

Phosphor-converted LEDs may be designed so that all of the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED.

Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and desired color-rendering properties.

SUMMARY

This specification discloses pixelated array light emitters with closely-spaced pixels and ultra-smooth sidewalls, as well as methods for making such arrays. In the disclosed methods, a converter layer of phosphor particles dispersed in a binder is disposed on a surface of a carrier, and then singulated by saw cuts or similar methods to form an array of phosphor pixels. The binder is fully cured prior to singulation of the converter layer. Further, the carrier is rigid rather than flexible. As a consequence of fully curing the binder and of using a rigid carrier to support the converter layer, singulation results in phosphor pixels having smooth side walls. The array of phosphor pixels is subsequently attached to a corresponding array of LEDs with an adhesive layer, separate from the binder used to form the converter layer.

The pixel sidewalls may be formed with controlled morphology. For example, a tapered saw blade may be used in the singulation step to form phosphor pixels with sidewalls oriented at acute or obtuse angles with respect to the carrier surface.

The pixelated array light emitters disclosed in this specification may be used, for example, for illumination, camera flash, automotive lighting, and microLED display applications.

Other embodiments, features and advantages of the present invention will become more apparent to those skilled in the art when taken with reference to the following more detailed description of the invention in conjunction with the accompanying drawings that are first briefly described.

DETAILED DESCRIPTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention.

Figure 1:
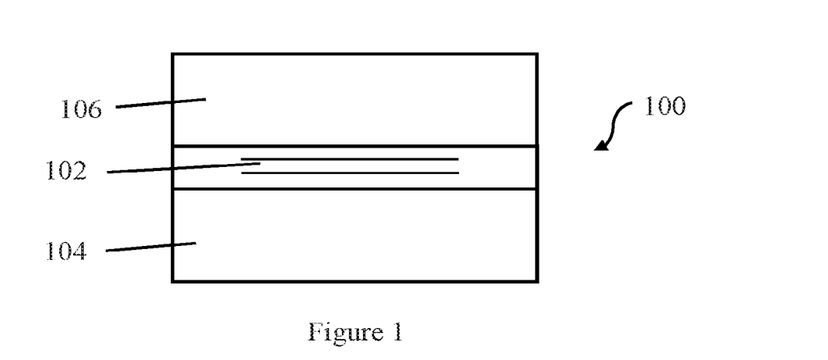
FIG. 1 shows a schematic cross-sectional view of an example pcLED.

FIG. 1 shows an example of an individual pcLED 100 comprising a semiconductor diode structure 102 disposed on a substrate 104, together considered herein an "LED", and a phosphor layer 106 disposed on the LED. Semiconductor diode structure 102 typically comprises an active region disposed between n-type and p-type layers. Application of a suitable forward bias across the diode structure results in emission of light from the active region. The wavelength of the emitted light is determined by the composition and structure of the active region.

The LED may be, for example, a III-Nitride LED that emits blue, violet, or ultraviolet light. LEDs formed from any other suitable material system and that emit any other suitable wavelength of light may also be used. Other suitable material systems may include, for example, III-Phosphide materials, III-Arsenide materials, and II-VI materials.

Any suitable phosphor materials may be used, depending on the desired optical output from the pcLED.

Figure 2A:
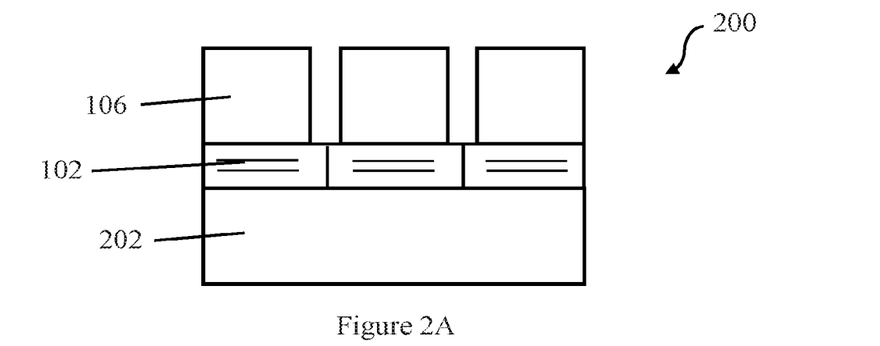
FIGS. 2A and 2B show, respectively, cross-sectional and top schematic views of an array of pcLEDs.
Figure 2B:
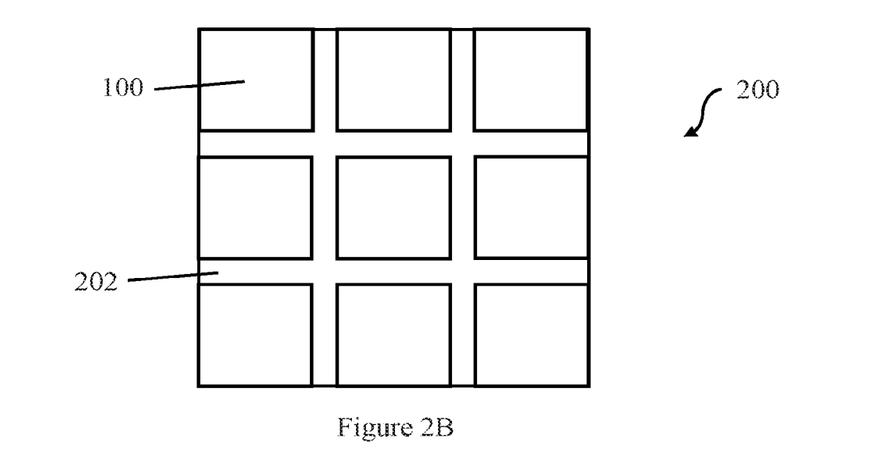

FIGS. 2A-2B show, respectively, cross-sectional and top views of an array 200 of pcLEDs 100 including phosphor pixels 106 disposed on a substrate 202. Such an array may include any suitable number of pcLEDs arranged in any suitable manner. In the illustrated example the array is depicted as formed monolithically on a shared substrate, but alternatively an array of pcLEDs may be formed from separate individual pcLEDs. Substrate 202 may optionally comprise CMOS circuitry for driving the LED, and may be formed from any suitable materials.

Figure 3A:
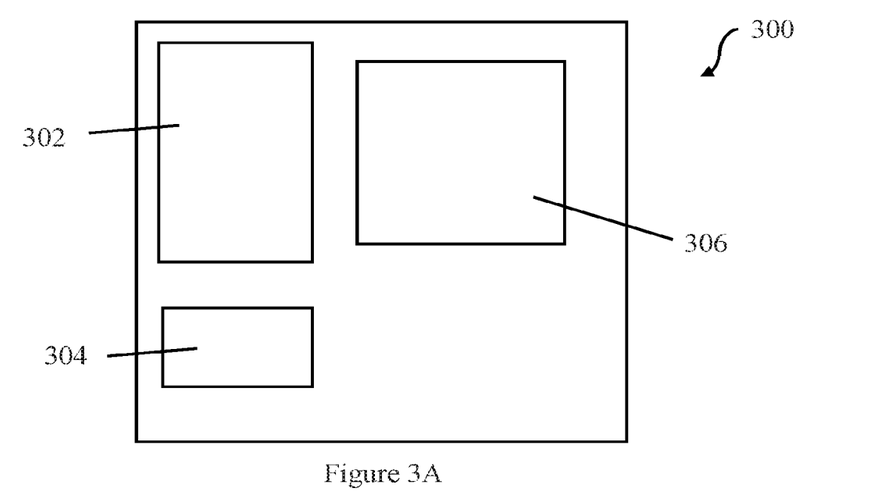
FIG. 3A shows a schematic top view an electronics board on which an array of pcLEDs may be mounted, and FIG. 3B similarly shows an array of pcLEDs mounted on the electronic board of FIG. 3A.
Figure 3B:
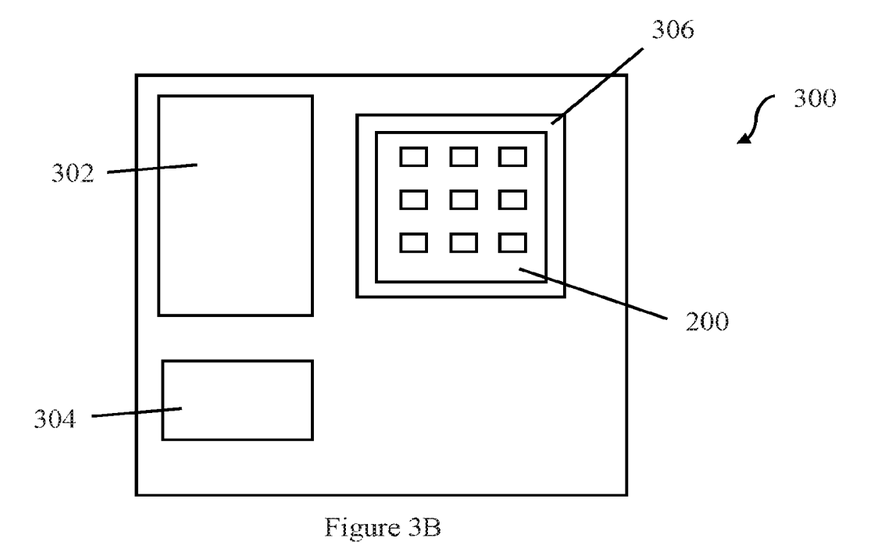

As shown in FIGS. 3A-3B, a pcLED array 200 may be mounted on an electronics board 300 comprising a power and control module 302, a sensor module 304, and an LED attach region 306. Power and control module 302 may receive power and control signals from external sources and signals from sensor module 304, based on which power and control module 302 controls operation of the LEDs. Sensor module 304 may receive signals from any suitable sensors, for example from temperature or light sensors. Alternatively, pcLED array 200 may be mounted on a separate board (not shown) from the power and control module and the sensor module.

Figure 4A:
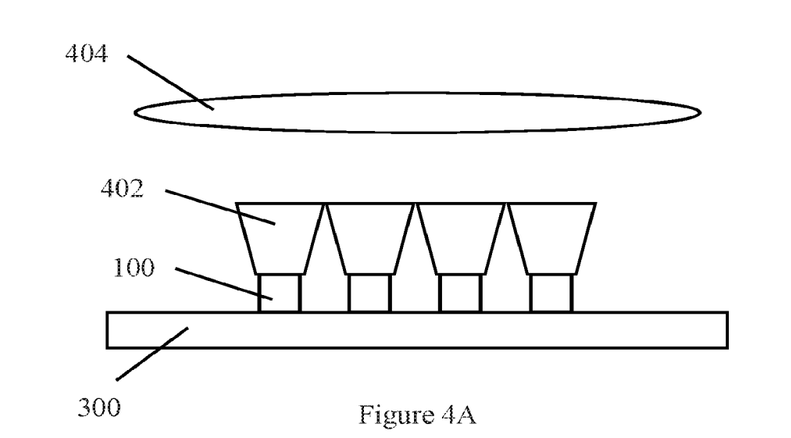
FIG. 4A shows a schematic cross sectional view of an array of pcLEDs arranged with respect to waveguides and a projection lens.
Figure 4B:
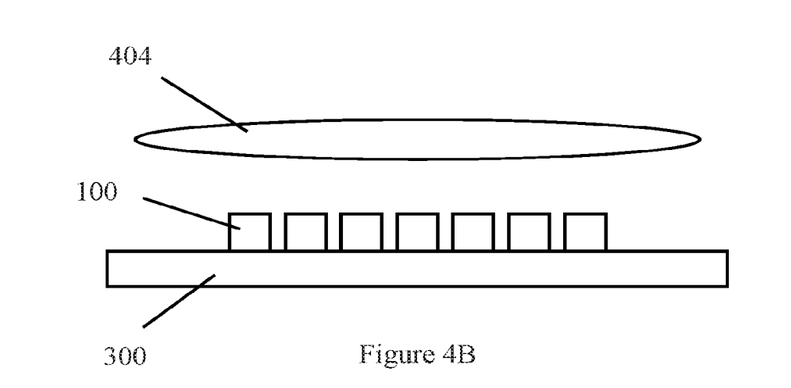
FIG. 4B shows an arrangement similar to that of FIG. 4A, without the waveguides.

Individual pcLEDs may optionally incorporate or be arranged in combination with a lens or other optical element located adjacent to or disposed on the phosphor layer. Such an optical element, not shown in the figures, may be referred to as a "primary optical element". In addition, as shown in FIGS. 4A-4B a pcLED array 200 (for example, mounted on an electronics board 300) may be arranged in combination with secondary optical elements such as waveguides, lenses, or both for use in an intended application. In FIG. 4A, light emitted by pcLEDs 100 is collected by waveguides 402 and directed to projection lens 404. This arrangement may be suitable for use, for example, in automobile headlights. In FIG. 4B, light emitted by pcLEDs 100 is collected directly by projection lens 404 without use of intervening waveguides. This arrangement may particularly be suitable when pcLEDs can be spaced sufficiently close to each other, and may also be used in automobile headlights as well as in camera flash applications. A microLED display application may use similar optical arrangements to those depicted in FIGS. 4A-4B, for example. Generally, any suitable arrangement of optical elements may be used in combination with the pcLEDs described herein, depending on the desired application.

Converter layers comprising phosphor particles dispersed in a silicone binder may be laminated onto a semiconductor LED surface to make a phosphor-converted LED emitting white light, or light of a desired color. The nature of the silicone binder allows for adhesion to the semiconductor surface during curing of the binder at the same time the silicone binder hardens during cross-linking. However, curing the binder results in shrinkage of the total volume (~1% to ~3%) of the converter layers. For large LEDs the shrinkage is inconsequential. However, for closely spaced pixel arrays, for example in microLEDs, this shrinkage can lead to uncontrolled separation between pixels and poor sidewall structure such as rough topography or slanted or slumped walls.

As summarized above, the methods disclosed in this specification separate the step of cross-linking the silicone or other binder to form a solid binder for the phosphor particles from the step of attaching the phosphor pixels to the semiconductor LED surfaces, and also support the converter layer on a rigid carrier during singulation of the converter layer to form phosphor pixels. This results in much improved sidewall surface quality and angle. Further, the pixels may be formed with a tapered saw blade to have angled side walls that do not change from the sawn shape after the converter layer is attached. An array of phosphor pixels formed in this manner and supported by a carrier may be attached to a corresponding array of LEDs. That is, the LEDs may be attached by parallel placement in a single step rather than by pick-and-place of individual LEDs or phosphor pixels. Pixels in the resulting pcLED pixelated array may have a spacing of, for example, about 5 microns to about 200 microns, for example less than or equal to about 20 microns, with good uniformity in pixel spacing and side wall angles.

Figure 5A:
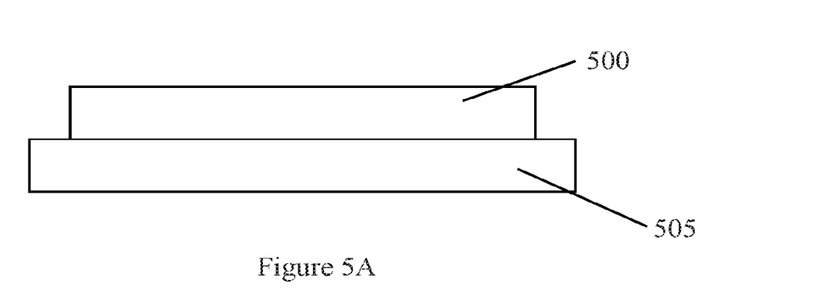
FIG. 5A, FIG. 5B, FIG. 5C, FIG. 5D, FIG. 5E, FIG. 5F, and FIG. 5G are partial cross-sectional views that schematically show stages in an example method for fabricating a pixelated array of light emitters with closely-spaced pixels and ultra-smooth sidewalls.

The partial cross-sectional views of FIGS. 5A-5G schematically show stages in an example method for making a pixelated array of light emitters with closely-spaced pixels and ultra-smooth sidewalls. In FIG. 5A, a phosphor layer 500 is deposited on a phosphor carrier substrate 505. Phosphor layer 500 comprises phosphor particles dispersed in a binder such as a silicone binder, for example. Any suitable phosphor material may be used. Suitable phosphor materials may include, for example, YAG, LuAG, silicates, BOSE, β-SiAlON, SCASN, BSSN, KSiF:Mn, SLA, and quantum dots. Phosphor layer 500 may have a thickness perpendicular to carrier substrate 505 of, for example, about 20 microns to about 500 microns.

Conventionally a phosphor layer 500 may be deposited on a flexible support, such as a tape for example. In such cases, during a singulation step as described below the flexible support may flex, stretch, or otherwise deform sufficiently to degrade the shape and the smoothness of the phosphor pixel sidewalls formed by singulation of the phosphor layer.

In contrast, in the methods disclosed in this specification phosphor carrier 505 is rigid. By rigid, this specification means that carrier 505 does not flex, stretch, or otherwise deform significantly during the singulation step. Phosphor carrier 505 may be formed, for example, from a glass or from any other suitable rigid material. Phosphor carrier 505 may be formed from a borosilicate glass, for example. Phosphor carrier 505 may have a thickness of, for example, about 50 microns to about 200 microns, for example of about 100 microns. Any suitable thickness for phosphor carrier 505 may be used.

After phosphor layer 500 is deposited on phosphor carrier 505, the binder in phosphor layer 500 is fully cured by, for example, thermal curing. All or essentially all shrinkage of phosphor layer 500 resulting from curing occurs at this step.

Figure 5B:
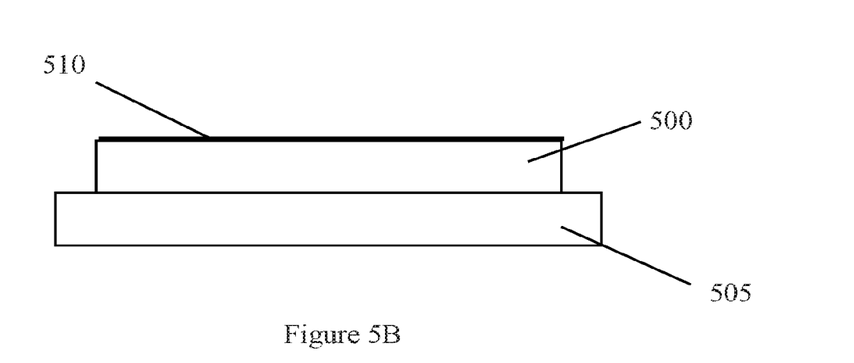

Subsequently, as shown in FIG. 5B, an adhesive layer 510 is deposited on a top surface of phosphor layer 500 to be attached to LEDs. Adhesive layer 510 may be deposited, for example, by spin-coating or thin film coating. Adhesive layer 510 may be, for example, a silicone glue layer. Such a silicone glue may be identical to a silicone material used as binder in phosphor layer 500. However, adhesive layer 510 is used specifically to attach phosphor layer 500 to LEDs.

Adhesive layer 510 may have a thickness of, for example, about 100 nanometers to about 5 microns. Preferably, the adhesive layer thickness is about the minimum necessary to enable attachment of phosphor pixels formed form the phosphor layer to an array of LED pixels on the semiconductor device. Adhesive layer 510 may be subjected to heat or UV light (B-staging) to remove the majority of solvent to form a dry film without fully curing the adhesive layer.

Figure 5C:
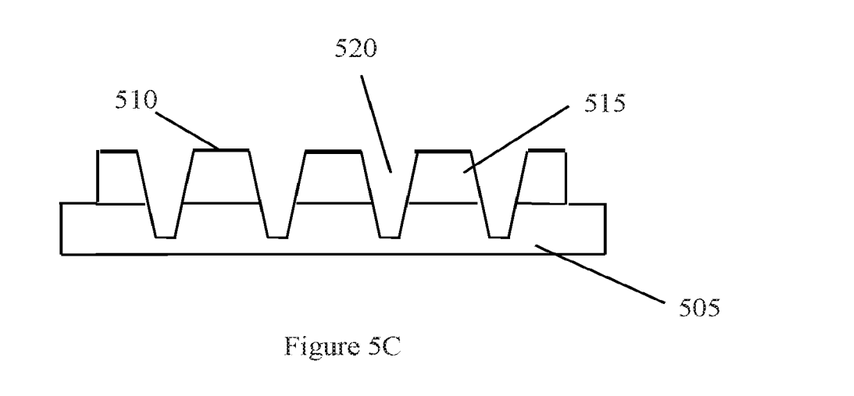

Subsequently, as shown in FIG. 5C, individual phosphor pixels are defined (singulated) by forming trenches 520 through adhesive layer 510 and phosphor layer 500 to form an array of phosphor pixels 515. This may be done by sawing, for example, but any suitable singulation method may be used. The phosphor pixels may be formed in a rectangular array, for example, by intersecting trenches formed in phosphor layer 500. Optionally, as shown, trenches 520 may penetrate into but not entirely through phosphor carrier substrate 505.

Because phosphor layer 500 has been fully cured and because phosphor carrier 505 is rigid, rather than a flexible tape for example, the singulation step defines the final shape of the sidewalls of the phosphor pixels and the sidewalls may be very smooth. The sidewalls of the phosphor pixels may have a roughness parameter Ra of, for example, less than or equal to about 10 nanometers, less than or equal to about 100 nanometers, or less than or equal to about 200 nanometers.

Sawing a fully cured phosphor layer on a rigid support also helps keep the saw blade clean.

Furthermore, the angle of the saw blade can be used to control the angle of the phosphor pixel sidewalls relative to the top light-output surface of the phosphor pixels. For example, a tapered saw blade may be used to form angled phosphor pixel sidewalls, as shown in FIG. 5C for example. Such angled phosphor pixel sidewalls may advantageously help to extract or direct light out of the phosphor pixels.

Trenches 520 may have a width of, for example, about 5 microns to about 200 microns. Trenches having tapered sides (FIG. 5C) may have a narrowest width of for example, about 5 microns to about 200 microns, and a greatest width of, for example, about 5 microns to about 200 microns. Trenches 520 may be spaced apart from each other by, for example, about 5 microns to about 200 microns.

Figure 5D:
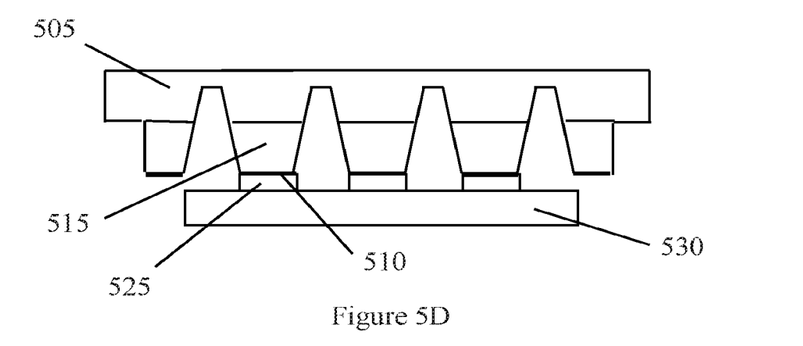

Subsequently, as shown in FIG. 5D, each phosphor pixel 515 in the array of phosphor pixels is aligned with and attached to a corresponding LED 525 in an array of semiconductor LEDs. LEDs 525 may be supported by a substrate 530, for example, which may be formed from any suitable material. The LEDs are attached to the phosphor pixels by adhesive layer 510, which is fully cured in the attachment step to bond the LEDs and the phosphor pixels to each other.

Figure 5E:
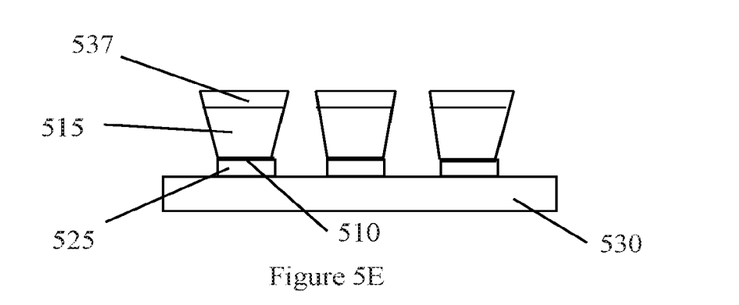

Subsequently, as shown in FIG. 5E, a sufficient thickness of phosphor carrier 505 is removed so that phosphor pixels 515 are no longer interconnected by the phosphor carrier and side walls 535 of the phosphor pixels and of the LEDs are exposed for side coating, described next. Optionally, each individual phosphor pixels retains a portion 537 of carrier 505 on its upper light output surface as shown in FIG. 5E. Alternatively, all of phosphor carrier 505 is removed at this step.

Figure 5F:
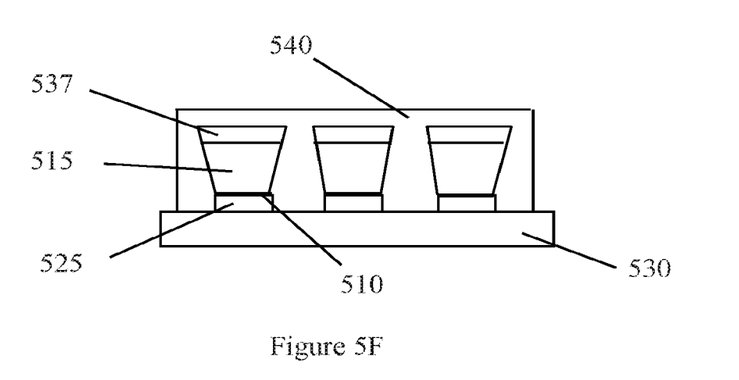

Subsequently, as shown schematically in FIG. 5F, a reflective or scattering material 540 is deposited on the top and sides of the phosphor pixels and the sides of the LEDs. Reflective or scattering material 540 may be or comprise, for example, a light scattering material such as $TiO_2$ particles embedded in silicone, one or more reflective metal layers, or one or more Distributed Bragg Reflector (DBR) structures formed from a stack of alternating layers of high and low refractive index material. Reflective metal layers may be deposited by vapor deposition or sputtering, for example. DBR structures may be deposited by atomic layer deposition, for example.

Figure 5G:
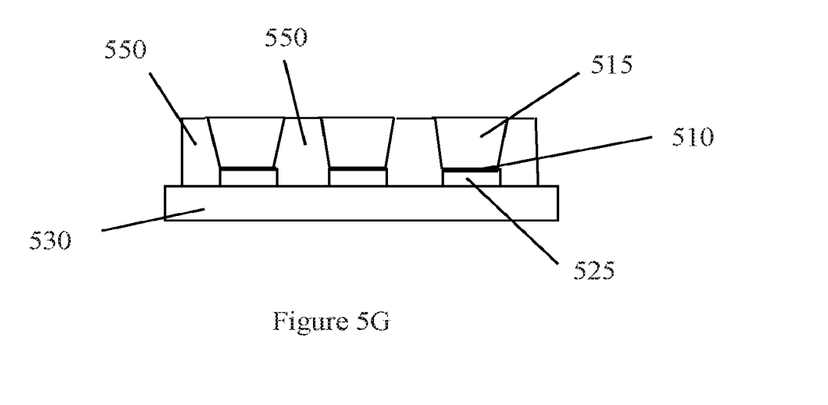

Subsequently, as shown in FIG. 5G, excess reflective or scattering material 540 is removed from the upper light output surfaces of the phosphor pixels by any suitable method, for example by mechanical grinding or polishing. If portion 537 of carrier 505 had been retained on the top surface of the phosphor pixel it can be entirely removed at this step. Alternatively, a portion of carrier 505 may be retained on the top light-output surface of each phosphor pixel through this step as well. Remaining portions of reflective or scattering material 540 form side walls 550 on the phosphor pixels, the glue layer, and optionally on the LEDs, optically isolating individual pcLED pixels from each other.

Advantageously, the smooth phosphor pixel sidewalls formed by the methods disclosed in this specification facilitate formation of highly reflective DBR structures.

Depending on the intended application for the pcLEDs and their dimensions, the resulting pixelated array shown in FIG. 5G may be maintained essentially intact, transferred as an array to another substrate, or divided into separate pcLEDs.

The improvement in phosphor pixel sidewall smoothness resulting from the methods disclosed in this specification was demonstrated by measurements made on two comparative examples. In one example, the sidewalls of phosphor pixels prepared by sawing a partially cured phosphor layer supported on a flexible tape were measured to have a roughness parameter Ra of about 300 nanometers. In contrast, in an otherwise similar example in which the phosphor layer was fully cured and supported on a rigid carrier the sidewalls of the pixels were measured to have a roughness parameter Ra of about 100 nanometers.

This disclosure is illustrative and not limiting. Further modifications will be apparent to one skilled in the art in light of this disclosure and are intended to fall within the scope of the appended claims.

The invention claimed is:

1. A method of fabricating a wavelength converter structure, the method comprising:
   depositing on a first surface of a substrate a phosphor layer comprising phosphor particles dispersed in a binder;
   curing the binder after depositing the phosphor layer on the first surface of the substrate;
   depositing an adhesive layer on the phosphor layer after curing the binder;
   forming a plurality of phosphor pixels by singulating the adhesive layer and the phosphor layer, the phosphor pixels being spaced apart from each other by 5 to 50 microns, and
   depositing reflective or scattering material comprising $TiO_2$ particles embedded in silicone between the phosphor pixels.

2. The method of claim 1, wherein curing the binder comprises fully curing the binder.

3. The method of claim 1, wherein the adhesive layer is deposited by spin-coating or thin film coating.

4. The method of claim 1, wherein the adhesive is or comprises a material identical with the binder of the phosphor layer.

5. The method of claim 1, wherein forming the phosphor pixels define phosphor pixel side walls having a roughness parameter Ra of less than or equal to about 10 nanometers.

6. The method of claim 1, wherein forming the phosphor pixels define phosphor pixel side walls that are oriented at acute or obtuse angles with respect to the first surface of the substrate.

7. The method of claim 1, wherein singulating the adhesive layer and the phosphor layer comprises cutting through the adhesive and phosphor layer with a saw.

8. The method of claim 7, wherein the saw comprises a tapered blade that defines phosphor pixel side walls oriented at acute or obtuse angles with respect to the first surface of the substrate.

9. The method of claim 1, comprising:
removing a sufficient portion of the substrate from a second surface of the substrate, opposite from the first surface; and
coating the exposed phosphor pixel side walls with a reflective or scattering material.

10. The method of claim 9, wherein the reflective or scattering material comprises DBR structures.

11. The method of claim 1, further comprising subjecting the adhesive layer to heat or UV light to form a dry film without fully curing the adhesive layer.

12. The method of claim 1 wherein the phosphor pixels are rectangular.

13. The method of claim 1, comprising removing an entirety of the substrate after forming the plurality of pixels.

14. The method of claim 1, wherein the substrate is rigid.

15. The method of claim 1, wherein the phosphor layer has a thickness of about 50 microns to about 200 microns.

16. The method of claim 1, wherein forming the pixels comprises forming the trenches to have a width of about 5 microns to about 200 microns.

17. The method of claim 1, wherein the adhesive layer has a thickness of about 0.1 microns to about 5 microns.

18. A method of fabricating a wavelength converter structure, the method comprising:
depositing on a first surface of a substrate a phosphor layer comprising phosphor particles dispersed in a binder;
curing the binder after depositing the phosphor layer on the first surface of the substrate;
depositing an adhesive layer on the phosphor layer after curing the binder; and
forming a plurality of phosphor pixels by singulating the adhesive layer and the phosphor layer to define phosphor pixel side walls having a roughness parameter Ra of less than or equal to about 100 nanometers, the phosphor pixels being spaced apart from each other by 5 to 50 microns.

19. A method of fabricating a wavelength converter structure, the method comprising:
depositing on a first surface of a substrate a phosphor layer comprising phosphor particles dispersed in a binder;
curing the binder after depositing the phosphor layer on the first surface of the substrate;
depositing an adhesive layer on the phosphor layer after curing the binder;
forming a plurality of phosphor pixels that are rectangular and spaced apart from each other by singulating the adhesive layer and the phosphor layer;
removing an entirety of the substrate after removing forming the plurality of pixels;
attaching a corresponding LED to each of the phosphor pixels to form a microLED array; and
depositing reflective or scattering material comprising $TiO_2$ particles embedded in silicone between the phosphor pixels.

* * * * *